United States Patent [19]
Mukogawa et al.

[11] Patent Number: 5,928,786
[45] Date of Patent: Jul. 27, 1999

[54] MONOCRYSTALLINE SILICON WAFER AND METHOD OF THERMALLY OXIDIZING A SURFACE THEREOF

[75] Inventors: Yasukazu Mukogawa; Yasuhiro Kimura, both of Hyogo, Japan

[73] Assignee: Mitsubishi Denki Kabushiki Kaisha, Tokyo, Japan

[21] Appl. No.: 08/595,145

[22] Filed: Feb. 1, 1996

[30] Foreign Application Priority Data

Mar. 28, 1995 [JP] Japan .................................... 7-069497

[51] Int. Cl.$^6$ ........................................................ B32B 9/00
[52] U.S. Cl. ........................ 428/409; 428/426; 428/428; 428/446; 428/700
[58] Field of Search .................. 428/426, 700, 428/446, 409, 428

[56] References Cited

U.S. PATENT DOCUMENTS

| | | | |
|---|---|---|---|
| 4,053,335 | 10/1977 | Hu | 148/174 |
| 4,447,497 | 5/1984 | Manasevit | 428/446 |
| 5,397,903 | 3/1995 | Hirose | 257/51 |
| 5,679,475 | 10/1997 | Yamagata | 428/698 |

FOREIGN PATENT DOCUMENTS 0602995   6/1994   European Pat. Off. .

OTHER PUBLICATIONS

Oellig et al., "Ultrathin gate oxides formed by catalytic oxidation of silicon", Appl. Phys. Lett. 50 (23), Jun. 8, 1987, pp. 1660–1662.

Soukiassian et al., "SiO$_2$–Si interface formation by catalytic oxidation using alkali metals and removal of the catalyst species", J. Appl. Phys. 60 (12), Dec. 15, 1986, pp. 4339–4341.

Mayo et al., "Thermodynamic Considerations in the Use of Polysilicon Oxidation Tubes for Clean SiO$_2$ Film Preparation", J. Electrochem. Soc.: Solid–State Science and Technology, Jan. 1978, vol. 125, No. 1, pp. 106–110.

Tan, Samantha H., "Application of vapor phase decomposition techniques (VPD/AAS and ICP–MS) for trace element analysis in oxide coatings on silicon", Nuclear instruments and Methods in Physics Research B99 (1995), pp. 458–461.

Werkhoven et al., "Wet and Dry HF–Last Cleaning Process for High–Integrity Gate Oxides", IEDM 92, pp. 633–636.

Wolf et al., "Silicon Processing for the VLSI Era—vol. 1: Process Technology", Lattice Press, 1986, pp. 63–66.

Kissinger et al., "The gettering efficiency of a direct bonded interface", J. Appl. Phys. 74 (11), Dec. 1, 1993, pp. 6576–6579.

Osburn et al., "Silicon Gate Oxide Thickness Uniformity during HCl Oxidation", J. Electrochem. Soc., vol. 138, No. 1, Jan. 1991, pp. 268–277.

*Primary Examiner*—Timothy M. Speer
*Attorney, Agent, or Firm*—McDermott, Will & Emery

[57] ABSTRACT

A monocrystalline silicon wafer is improved so as not to cause enhanced oxidation at the time of forming a gate oxide film. The monocrystalline silicon wafer includes a monocrystalline silicon substrate. The monocrystalline silicon substrate has potassium concentration of at most $2\times10^{11}$ atoms/cm$^2$ at an outer surface thereof.

11 Claims, 9 Drawing Sheets

MONOCRYSTALLINE SILICON WAFER AND METHOD OF THERMALLY OXIDIZING A SURFACE THEREOF

BACKGROUND OF THE INVENTION

1. Field of the Invention

The present invention generally relates to a monocrystalline silicon wafer, and more particularly, to a monocrystalline silicon wafer improved so that enhanced oxidation will not be caused at the time of forming an oxide film on a surface thereof. The present invention also relates to a method of thermally oxidizing a surface of such a monocrystalline silicon wafer.

2. Description of the Background Art

Formation of a thermal oxide film on a surface of a monocrystalline silicon wafer is an essential step in a method of manufacturing a semiconductor device. FIG. 11 is a series of cross sections sequentially showing a semiconductor device in each of the steps in a method of manufacturing a field effect transistor, including the step of forming a silicon oxide film, that is, a thermal oxide film.

Referring to FIG. 11(a), a monocrystalline silicon substrate 1 is prepared.

Referring to FIG. 11(b), a LOCOS (LOCal Oxidation of Silicon) oxide film 2 for separating an active region from another is formed at a main surface of monocrystalline silicon substrate 1. Then, the surface of monocrystalline silicon substrate 1 is thermally oxidized, whereby a silicon oxide film 3 which is a base of a gate oxide film is formed. A polysilicon film 4a which is a base of a gate electrode is formed to cover silicon oxide film 3.

Referring to FIG. 11(b) and (c), a gate insulating film 5a has a gate electrode 6a are formed on an active region by selective etching of silicon oxide film 3 and polysilicon film 4a.

Referring to FIG. 11(c) and (d), impurity ions 30 are implanted into a surface of the active region using gate electrode 6 has a mask, thereby forming a source/drain region 7.

Referring to FIG. 11(d) and (e), a interlayer insulating film 8 is formed to cover gate electrode 6. A contact hole 9 for exposing a portion of a surface of source/drain region 7 is formed in interlayer insulating film 8. An aluminum (Al) interconnection 31 which is a bit line is formed to be electrically in contact with source/drain region 7 through contact hole 9, whereby an MOSFET (Metal Oxide Semiconductor Field Effect Transistor) is completed.

FIG. 12 is a diagram conceptually showing a thermal oxidation furnace (vertical type furnace) for carrying out the step of oxidizing a surface of a semiconductor substrate to form a silicon oxide film (the step shown in FIG. 11(b)).

Referring to FIG. 12, the thermal oxidation furnace is provided with a reaction tube 10. Reaction tube 10 is surrounded by an outer wall 11. A heater 12 is provided around outer wall 11. A gas discharging tube 13 for discharging gas within reaction tube 10 is connection to outer wall 11. A gas supplying tube 14 for supplying reactive gas into reaction tube 10 is connected to reaction tube 10. A boat 32 is to be inserted into reaction tube 10 by a boat elevator 15. Dummy monitor wafers 16 and wafers 17 for practical use are to be placed in boat 32. Dummy monitor wafers 16 are located in reaction tube 10 so as to control gas flow and to prevent maldistribution of temperature. Normally, 26 dummy wafers 16 and 100 wafers 17 for practical use are placed therein.

An LOCOS oxide film is also formed using this thermal oxidation furnace.

FIG. 13 is a series of cross sections sequentially showing a semiconductor device in each of the steps in a method of forming an LOCOS oxide film.

Referring to FIG. 13(a), a monocrystalline silicon substrate 1 is formed.

Referring to FIG. 13(b), an $SiO_2$ film 18 is formed on monocrystalline silicon substrate 1. A silicon nitride film 19 is then formed on $SiO_2$ film 18 to cover a portion of the substrate where an active region is to be formed.

Referring to FIG. 13(b) and (c), a surface of monocrystalline silicon substrate 1 is oxidized using silicon nitride 19 as a mask, thereby forming LOCOS oxide film 2.

Referring to FIG. 13(c) and (d), silicon nitride film 19 is removed, and LOCOS oxide film 2 for separating an active region from another is formed at a main surface of semiconductor substrate 1.

Formation of LOCOS oxide film 12 shown in FIG. 13(c) is carried out by the thermal oxidation furnace shown in FIG. 12.

As described above, a silicon oxide film is formed by inserting a monocrystalline silicon wafer into a thermal oxidation furnace and thermally oxidizing the wafer. In particular, a gate oxide film is one of the important elements in a silicon oxide film which determine the property of a semiconductor device. Accordingly, thickness of a gate oxide film has been managed very strictly. Nevertheless, variation in the thickness of the gate oxide film has not been eliminated.

SUMMARY OF THE INVENTION

It is therefore an object of the present invention to provide a monocrystalline silicon wafer improved so that a silicon oxide film having a uniform thickness can be formed on a surface of the monocrystalline silicon wafer.

It is another object of the present invention to provide a monocrystalline silicon wafer improved so that a gate insulating film having a uniform thickness can be formed at the time of thermal oxidation of a surface of the monocrystalline silicon wafer.

It is a further object of the present invention to provide a monocrystalline silicon wafer improved so that an LOCOS oxide film having a uniform thickness can be formed at the time of thermal oxidation of a surface of the monocrystalline silicon wafer.

It is a still further object of the present invention to provide a method of thermally oxidizing a surface of a monocrystalline silicon wafer, which is improved so that a silicon oxide film having a uniform thickness can be formed using such a monocrystalline silicon wafer.

A monocrystalline silicon wafer in accordance with a first aspect of the present invention includes a monocrystalline silicon substrate. The monocrystalline silicon substrate has potassium concentration of at most $2\times10^{11}$ atoms/cm$^2$ at an outer surface thereof.

A monocrystalline silicon wafer in accordance with a second aspect of the present invention includes a monocrystalline silicon substrate and a polysilicon substrate formed on a bottom surface of the monocrystalline silicon substrate. Potassium concentration at an interface between the monocrystalline silicon substrate and the polysilicon film is at most $2\times10^{11}$ atoms/cm$^2$.

A monocrystalline silicon wafer in accordance with a third aspect of the present invention includes a monocrystalline silicon substrate and a polysilicon film formed on a bottom surface of the monocrystalline silicon substrate. The polysilicon film has potassium concentration of at most $2\times10^{11}$ atoms/cm² at an outer surface thereof.

A monocrystalline silicon wafer in accordance with a fourth aspect of the present invention includes a monocrystalline silicon substrate. An oxide film containing phosphorus is formed on a bottom surface of the monocrystalline silicon substrate. A polysilicon film is formed on the bottom surface of the monocrystalline silicon substrate to cover the oxide film.

A monocrystalline silicon wafer in accordance with a fifth aspect of the present invention includes first and second monocrystalline silicon substrates which are attached to each other. Potassium concentration at a surface where the first and second monocrystalline silicon substrates are attached to each other is at most $2\times10^{11}$ atoms/cm².

A monocrystalline silicon wafer in accordance with a sixth aspect of the present invention includes a monocrystalline silicon substrate. The monocrystalline silicon substrate has potassium concentration of at most $1\times10^{16}$ atoms/cm³.

A monocrystalline silicon wafer in accordance with a seventh aspect of the present invention includes a monocrystalline silicon substrate and a polysilicon film formed on a bottom surface of the monocrystalline silicon substrate. The polysilicon film has potassium concentration of at most $1\times10^{16}$ atoms/cm³.

In a method of thermally oxidizing a surface of a monocrystalline silicon wafer in accordance with an eighth aspect of the present invention, a monocrystalline silicon wafer to be processed and a dummy wafer having potassium concentration of at most $2\times10^{11}$ atoms/cm² at an outer surface thereof are first placed in a thermal oxidation furnace. A surface of the monocrystalline silicon wafer is then thermally oxidized, whereby a thermal oxide film is formed on the surface of the monocrystalline silicon wafer.

In a method of thermally oxidizing a surface of a monocrystalline silicon wafer in accordance with a ninth aspect of the present invention, a monocrystalline silicon wafer to be processed and a dummy wafer having potassium content of at most $1\times10^{16}$ atoms/cm³ are first placed in a thermal oxidation furnace. A surface of the monocrystalline silicon wafer is then thermally oxidized, whereby a thermal oxide film is formed on the surface of the monocrystalline silicon wafer.

In a monocrystalline silicon wafer in accordance with the first aspect of the present invention, a silicon monocrystalline substrate has potassium concentration of at most $2\times10^{11}$ atoms/cm² at an outer surface thereof, and therefore, potassium contained in the monocrystalline silicon wafer will not diffuse at the time of thermal processing in a thermal oxidation furnace, and other monocrystalline silicon wafers will not be contaminated, as a result.

In a monocrystalline silicon wafer in accordance with the second aspect of the present invention, potassium concentration at an interface between a monocrystalline silicon substrate and a polysilicon film is at most $2\times10^{11}$ atoms/cm², and therefore, potassium contained in the monocrystalline silicon wafer will not contaminate other monocrystalline silicon wafers at the time of thermal processing in a thermal oxidation furnace.

In a monocrystalline silicon wafer in accordance with the third aspect of the present invention, a polysilicon film has potassium concentration of at most $2\times10^{11}$ atoms/cm² at an outer surface thereof, and therefore, potassium contained in the monocrystalline silicon wafer will not contaminate other monocrystalline silicon wafers at the time of thermal processing in a thermal oxidation furnace.

In a monocrystalline silicon wafer in accordance with the fourth aspect of the present invention, an oxide film containing phosphorus is formed on a bottom surface of a monocrystalline silicon substrate. The oxide film containing phosphorus has a gettering effect. Therefore, alkaline metal and alkaline earth metal contained in the monocrystalline silicon substrate are captured by the oxide film containing phosphorus. Accordingly, alkaline metal and alkaline earth metal contained in the monocrystalline silicon wafer will not contaminate other monocrystalline silicon wafers at the time of thermal processing in a thermal oxidation furnace.

In a monocrystalline silicon wafer in accordance with the fifth aspect of the present invention, potassium concentration at a surface where first and second monocrystalline silicon substrates are attached to each other is at most $2\times10^{11}$ atoms/cm², and therefore, potassium contained in the monocrystalline silicon wafer will not contaminate other monocrystalline silicon wafers at the time of thermal processing in a thermal oxidation furnace.

In a monocrystalline silicon wafer in accordance with a the sixth aspect of the present invention, a monocrystalline silicon substrate has potassium concentration of at most $1\times10^{16}$ atoms/cm³, and therefore, potassium contained in the monocrystalline silicon wafer will not contaminate other monocrystalline silicon wafers at the time of thermal processing in a thermal oxidation furnace.

In a monocrystalline silicon wafer in accordance with the seventh aspect of the present invention, a polysilicon film has potassium concentration of at most $1\times10^{16}$ atoms/cm³, and therefore, potassium contained in the monocrystalline silicon wafer will not contaminate other monocrystalline silicon wafers at the time of thermal processing in a thermal oxidation furnace.

In a method of thermally oxidizing a surface of a monocrystalline silicon wafer in accordance with the eighth aspect of the present invention, a dummy wafer having potassium concentration of at most $2\times10^{11}$ toms/cm² at an outer surface thereof is placed, and therefore, potassium contained in the dummy wafer will not contaminate a monocrystalline silicon wafer to be processed.

In a method of thermally oxidizing a surface of a monocrystalline silicon wafer in accordance with the ninth aspect of the present invention, a dummy wafer having potassium content of at most $1\times10^{16}$ atoms/cm³ is placed in a thermal oxidation furnace, and therefore, potassium contained in the dummy wafer will not contaminate a monocrystalline silicon wafer to be processed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

FIRST EMBODIMENT

Figure 1:
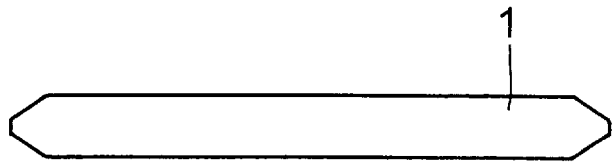
FIG. 1(a)–1(b) is a pair of diagrams respectively showing a monocrystalline silicon wafer in accordance with a first embodiment of the present invention in cross section, and a relation between potassium concentration at a surface of the monocrystalline silicon wafer and enhancement rate of oxidation in forming a gate oxide film.
Figure 1:
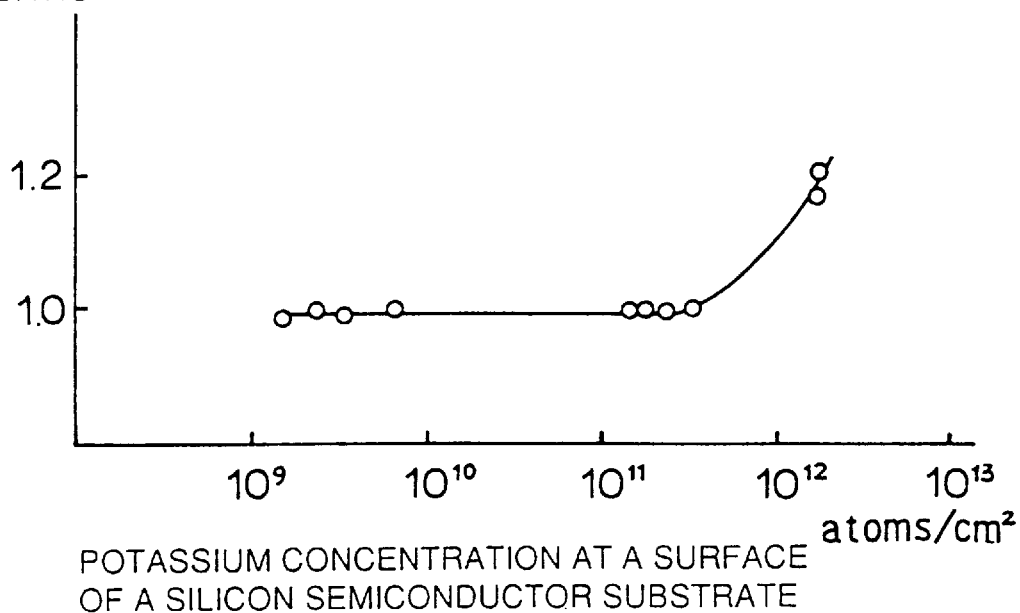

FIG. 1(a) is a cross section showing a monocrystalline silicon wafer in accordance with a first embodiment of the present invention. Referring to FIG. 1(a), the monocrystalline silicon wafer in accordance with the present embodiment has alkaline metal and alkaline earth metal of at most $2.6\times10^{11}$ atoms/cm$^2$ in total, sodium concentration of at most $5\times10^{10}$ atoms/cm$^2$, potassium concentration of at most $2\times10^{11}$ atoms/cm$^2$, and calcium concentration of at most $1\times10^{10}$ atoms/cm$^2$ at an outer surface thereof.

The following table 1 shows data obtained as a result of an attempt to form a gate oxide film having a thickness of 260 Å (a design value) using two monocrystalline silicon wafers (first embodiment and first comparative example) each having different concentration of alkaline metal and alkaline earth metal. The gate oxide film was formed at a temperature of 950° C. in a wet oxidation furnace which is a vertical type thermal processing furnace.

TABLE 1

| sample No. | thickness of gate oxide film | concentration of alkaline metal and alkaline earth metal at a surface of a silicon wafer (atoms/cm$^2$, per unit area) |
|---|---|---|
| first comparative example | $\bar{x}$ = 270 Å (264~279 Å) n = 3 | Na: $4.2 \times 10^{10}$ K: $1.8 \times 10^{12}$ Ca: $7.3 \times 10^{11}$ |
| first embodiment | $\bar{x}$ = 260 Å (257~262 Å) n = 3 | Na: $2.0 \times 10^{11}$ K: $1.2 \times 10^{11}$ Ca: $<1.0 \times 10^{10}$ |

As can be seen from the table 1, in the case of the first comparative example, a thickness of a gate oxide film varied in the range of 264 and 279 Å, and an average thickness thereof was 270 Å. On the other hand, in the case of the first embodiment, a thickness of a gate oxide film varied only in the small range of 257 to 262 Å, and an average thickness thereof was 260 Å.

It is considered that alkaline metal and alkaline earth metal cause variation in the thickness of the gate oxide film for the following reason.

Figure 2:
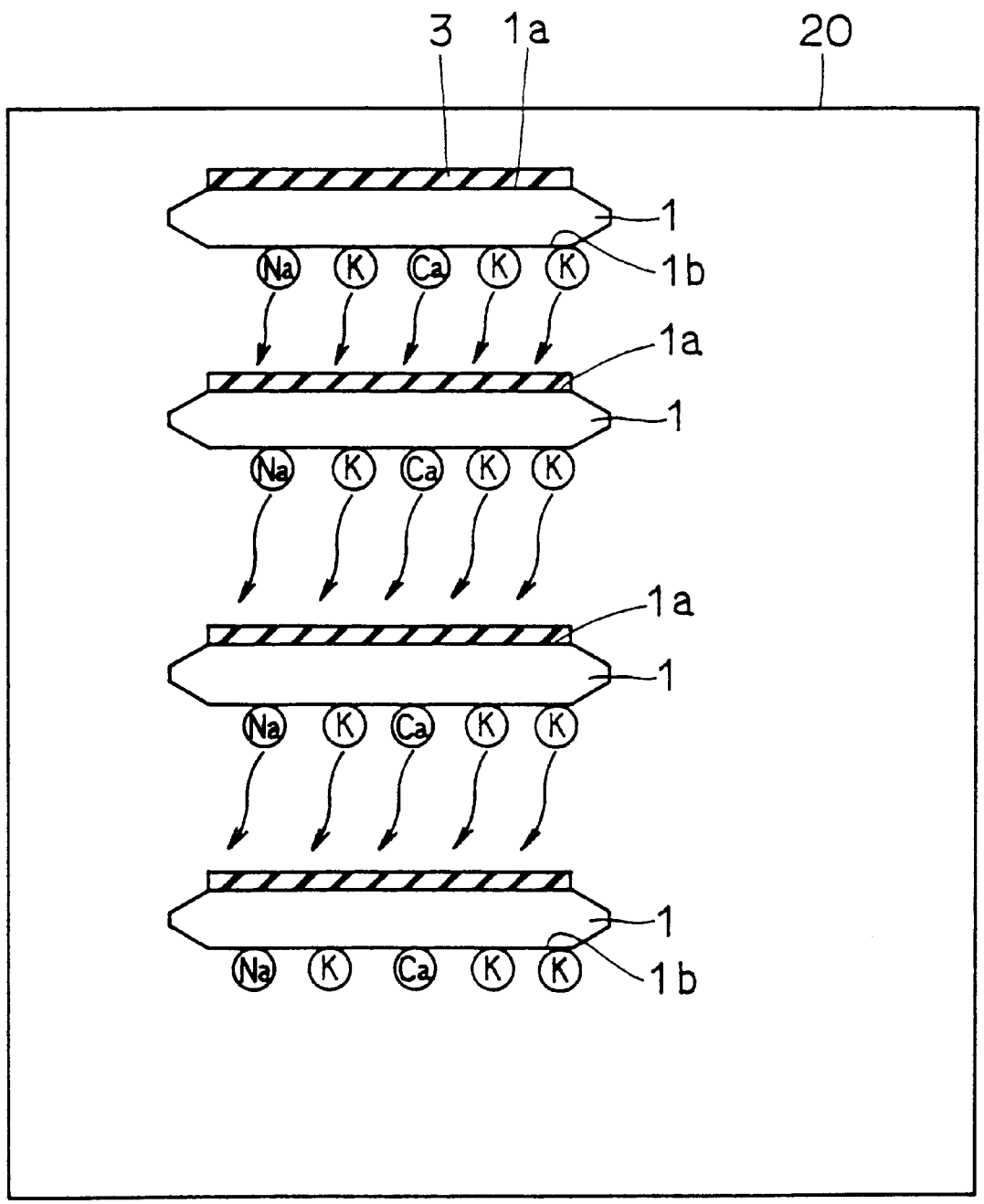
FIG. 2 is a diagram illustrating that sodium potassium and calcium will cause enhanced oxidation in forming a gate oxide film.

More specifically, referring to FIG. 2, when a silicon oxide film is formed on a surface 1a of monocrystalline silicon wafer 1 in a thermal oxidation furnace 20, alkaline metal and alkaline earth metal at a bottom surface 1a of monocrystalline silicon wafer 1 diffuse into a surface 1a of another monocrystalline silicon wafer 1, causing enhanced oxidation of that surface of another monocrystalline silicon wafer 1.

Since an amount of these alkaline metal and alkaline earth metal which serve as catalyst of the enhanced oxidation is small in the case of using the monocrystalline silicon wafer in accordance with the first embodiment, diffusion of alkaline metal and alkaline earth metal caused by thermal processing as shown in FIG. 2 is suppressed. Accordingly, variation in the thickness of the gate oxide film is eliminated.

FIG. 1(b) shows relationship between potassium concentration at a surface of a silicon semiconductor substrate and an enhancement rate of oxidation in forming the gate oxide film is formed at the surface of the silicon semiconductor substrate. There is no variation in the thickness of the gate oxide film in the case of the enhancement rate of 1, and variation thereof increases as the enhancement rate increases. As can be seen from FIG. 1(b), the enhancement rate changes significantly when potassium concentration exceeds $2\times10^{11}$ atoms/cm$^2$.

If potassium concentration at an outer surface of the monocrystalline silicon substrate is $2\times10^{12}$ atoms/cm$^2$, potassium concentration per unit volume is $1\times10^{16}$ atoms/cm$^3$.

Description of FIG. 1(b) is centered on potassium because an amount of potassium is largest in the total amount of alkaline metal and alkali earth metal existing in or at a surface of the monocrystalline silicon wafer. Reduction in the amount of potassium leads to reduction in an amount of other alkaline metal and alkaline earth metal.

SECOND EMBODIMENT

Figure 3:
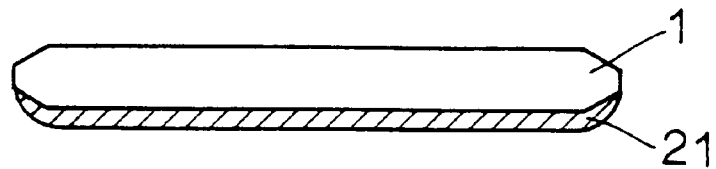
FIG. 3 is a cross section showing a monocrystalline silicon wafer in accordance with a second embodiment of the present invention.

FIG. 3 is a cross section showing a monocrystalline silicon wafer in accordance with a second embodiment of the present invention. A polysilicon film 21 for providing a gettering effect is formed on a bottom surface of a monocrystalline silicon substrate 1. Polysilicon film 21 used herein does not contain impurities of III and V groups. An interface between silicon semiconductor substrate 1 and polysilicon film 21 has alkaline metal and alkaline earth metal of at most $2.6 \times 10^{11}$ atoms/cm$^2$ in total, sodium concentration of at most $5 \times 10^{10}$ atoms/cm$^2$, potassium concentration of at most $2 \times 10^{11}$ atoms/cm$^2$, and calcium concentration of at most $1 \times 10^{10}$ atoms/cm$^2$. The following table 2 shows data obtained when a gate oxide film is formed on a surface of the monocrystalline silicon wafer in accordance with the second embodiment.

TABLE 2

| sample No. | thickness of gate oxide film | concentration of alkaline metal and alkaline earth metal at an interface between a polysilicon film and a silicon wafer (atoms/cm$^2$) |
| --- | --- | --- |
| second comparative example | 330 Å | Na: $4.2 \times 10^{10}$<br>K: $1.8 \times 10^{12}$<br>Ca: $7.3 \times 10^{11}$ |
| second embodiment | 300 Å | Na: $4.0 \times 10^{9}$<br>K: $<1.0 \times 10^{10}$<br>Ca: $<1 \times 10^{10}$ |

The above table 2 also shows data obtained when a monocrystalline silicon wafer (second comparative example) different from the second embodiment in concentration of alkaline metal and alkaline earth metal at an outer surface of a silicon monocrystalline substrate is used. The number of samples used for each of the second embodiment and the second comparative example is 3 (n=3).

The data in the above table 2 is a result of an attempt to form the gate oxide film having a thickness of 300 Å (a design value). The gate oxide film obtained in the second embodiment had an average thickness of 300 Å, while the gate oxide film in the second comparative example had an average thickness of 330 Å.

Figure 4:
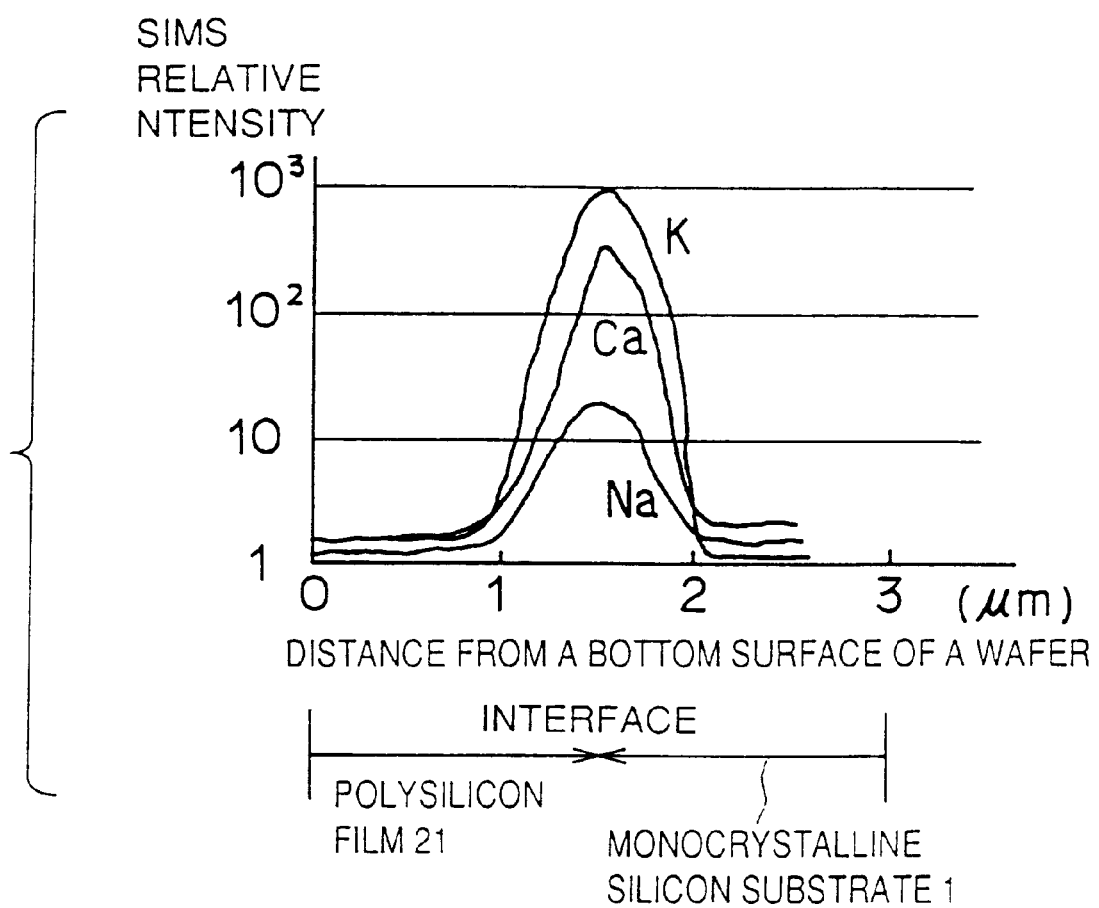
FIG. 4 is a diagram showing an SIMS profile of a monocrystalline silicon wafer having a polysilicon film, in which enhanced oxidation has been observed in forming a gate oxide film.

FIG. 4 shows an SIMS (Secondary Ion Mass Spectra) profile in the second comparative example, that is, in a section of a wafer including a polysilicon film in which enhanced oxidation of a gate oxide film has been observed. The abscissa indicates a distance from a bottom surface of the wafer, and the ordinate indicates an SIMS relative intensity.

As can be seen from FIG. 4, in the case of the monocrystalline silicon wafer (second comparative example) in which enhanced oxidation of the gate oxide film has been observed, there exists a large amount of sodium, potassium, and calcium at an interface between polysilicon film 21 and monocrystalline silicon substrate 1.

Figure 5:
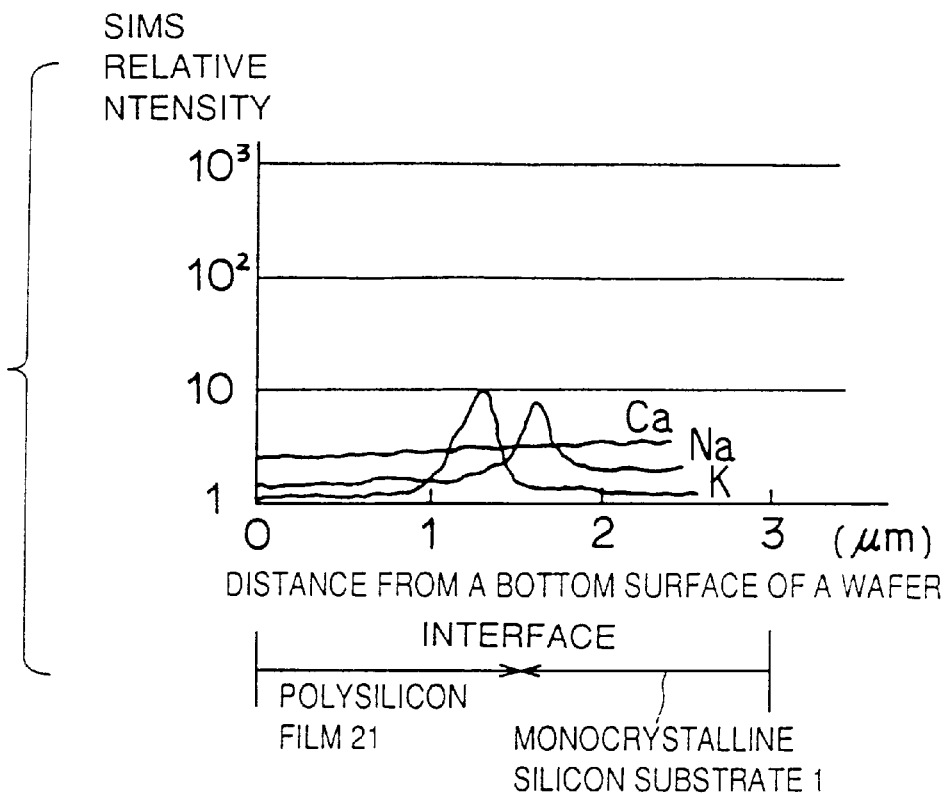
FIG. 5 is a diagram showing an SIMS profile of a monocrystalline silicon wafer having a polysilicon film, in which enhanced oxidation has not been observed in forming a gate oxide film.

FIG. 5 shows an SIMS profile in a section of the monocrystalline silicon wafer (second embodiment) in which enhanced oxidation of the gate oxide film has not been observed. As can be seen from FIG. 5, in the case of the second embodiment, there exists only a very small amount of sodium, potassium, and calcium at an interface between polysilicon film 21 and monocrystalline silicon substrate 1.

THIRD EMBODIMENT

Figure 6:
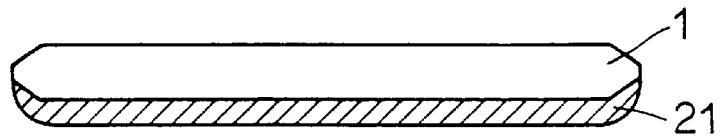
FIG. 6 is a cross section showing a monocrystalline silicon wafer in accordance with a third embodiment of the present invention.

FIG. 6 is a cross section showing a monocrystalline silicon wafer in accordance with a third embodiment of the present invention. The monocrystalline silicon wafer in accordance with the third embodiment includes a monocrystalline silicon substrate 1. A polysilicon film 21 is formed on a bottom surface of monocrystalline silicon substrate 1. Polysilicon silicon film 21 has alkaline metal and alkaline earth metal of at most $2.6 \times 10^{11}$ atoms/cm$^2$ in total, potassium concentration of at most $2 \times 10^{11}$ atoms/cm$^2$, sodium concentration of at most $5 \times 10^{10}$ atoms/cm$^2$, and calcium concentration of at most $1 \times 10^{10}$ atoms/cm$^2$ at an outer surface thereof. When potassium concentration per unit area is at most $2 \times 10^{11}$ atoms/cm$^2$, potassium concentration per unit volume in polysilicon film 21 is at most $1 \times 10^{16}$ atoms/cm$^3$.

Introduction of sodium, potassium, and calcium into polysilicon film 21 is caused by contamination in a CVD (Chemical Vapor Deposition) apparatus at the time of forming a polysilicon film, contamination of SiH$_4$ gas, contamination of N$_2$ gas used for purge gas, or the like. Therefore, a polysilicon film having small content of sodium, potassium and calcium as described above can be obtained by eliminating these contaminations. The use of the monocrystalline silicon wafer according to the third embodiment allows suppression of enhanced oxidation at the time of forming a gate insulating film on the surface of the monocrystalline silicon substrate.

FOURTH EMBODIMENT

Figure 7:
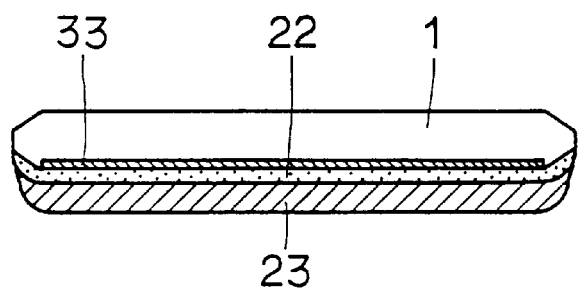
FIG. 7 is a cross section showing a monocrystalline silicon wafer in accordance with a fourth embodiment of the present invention.

FIG. 7 is a cross section showing a monocrystalline silicon wafer in accordance with a fourth embodiment of the present invention. In the monocrystalline silicon wafer in accordance with the fourth embodiment, an oxide film 22 containing phosphorus is formed on a bottom surface of a monocrystalline silicon substrate 1. A polysilicon film 23 is formed on the bottom surface of monocrystalline silicon substrate 1 to cover oxide film 22. Oxide film 22 containing phosphorus can getter mobile ions such as sodium, potassium and the like, and therefore, alkaline metal and the like, even if contained in monocrystalline silicon substrate 1, are gettered by oxide film 22. In FIG. 7, a reference numeral 33 indicates sodium, potassium and the like which have been gettered. Accordingly, mobile ions such as sodium will not diffuse outwards even if a gate oxide film is formed on a surface of monocrystalline silicon substrate 1 by thermal processing. Consequently, a thickness of a gate oxide film can be controlled.

It is noted that oxide film 22 containing phosphorus can be formed easily by an atmospheric pressure CVD method, a low pressure CVD method or the like.

FIFTH EMBODIMENT

The present embodiment relates to a method of manufacturing a monocrystalline silicon wafer having a polysilicon film.

Figure 8:
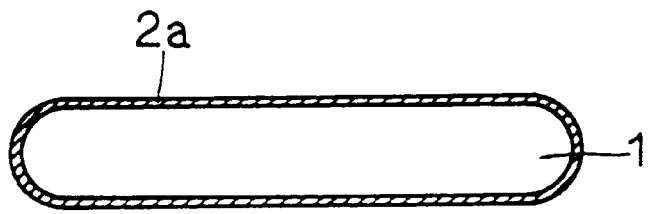
FIG. 8(a)–(c) is a series of cross sections sequentially showing a monocrystalline silicon substrate in each of the steps in a method of manufacturing a monocrystalline silicon wafer shown in FIG. 3.
Figure 8:
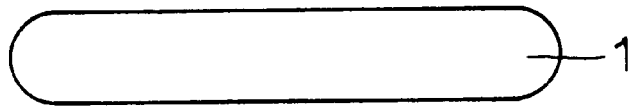
Figure 8:
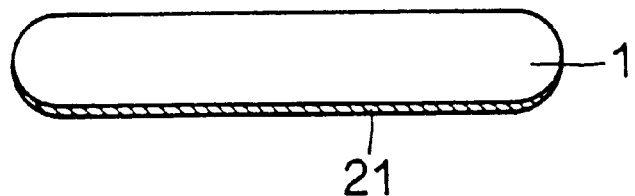

Referring to FIG. 8(a), a monocrystalline silicon substrate 1 which has been washed with alkali is prepared. A contaminant layer 2a formed of sodium, potassium or calcium is formed on a surface of alkali-washed monocrystalline silicon substrate 1. Contaminant layer 2a has sodium concentration of at least $5 \times 10^{10}$ atoms/cm$^2$, potassium concentration of at least $2 \times 10^{11}$ atoms/cm$^2$, or calcium concentration of at least $1 \times 10^{10}$ atoms/cm$^2$.

Referring to FIG. 8(a) and (b), the surface of monocrystalline silicon substrate 1 is washed with diluted hydrochloric acid or diluted hydrofluoric acid to remove contaminant layer 2a.

Referring to FIG. 8(b) and (c), a polysilicon film 21 is deposited on a bottom surface of monocrystalline silicon substrate 1. Thus, a monocrystalline silicon wafer with a polysilicon film, having alkaline metal and alkaline earth metal of at most $2.6\times10^{10}$ atoms/cm$^2$ in total, sodium concentration of at most $5\times10^{10}$ atoms/cm$^2$, potassium concentration of at most $2\times10^{11}$ atoms/cm$^2$, and calcium concentration of at most $1\times10^{10}$ atoms/cm$^2$ at an interface between monocrystalline silicon substrate 1 and polysilicon film 21, can be obtained.

SIXTH EMBODIMENT

The present embodiment relates to a method of thermally oxidizing a surface of a monocrystalline silicon wafer. Since a conventional apparatus shown in FIG. 11 is used for a thermal oxidation furnace in the present embodiment, a thermal oxidation furnace used herein will not be illustrated. A gate oxide film is normally formed by a method called batch processing in which a plurality of wafer are processed at a time. At this time, it is effective for reduction in variation in thickness and quality of a gate oxide film to place a fixed number of wafers in the thermal oxidation furnace. By placing a fixed number of wafers, gas flow can be controlled and maldistribution of temperature can be eliminated. Normally, wafers are often supplemented with wafers called monitor wafers or dummy wafers so that the fixed number of wafers are placed therein.

In the present embodiment, a monitor wafer and a dummy wafer each having alkaline mental and alkaline earth metal of at most $2.6\times10^{11}$ atoms/cm$^2$ in total, sodium concentration of at most $5\times10^{10}$ atoms/cm$^2$, and potassium concentration of at most $1\times10^{10}$ atoms/cm$^2$ are used. The use of such a monitor wafer and a dummy wafer prevents alkaline metal and alkaline earth metal from scattering in an oxidation furnace. Therefore, other wafers will not be contaminated. Consequently, control of the thickness of the gate oxide film can be facilitated.

SEVENTH EMBODIMENT

Figure 9:
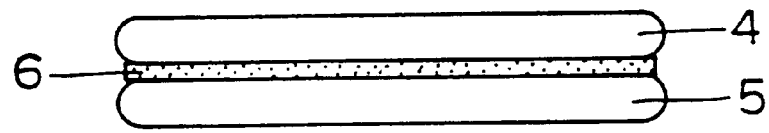
FIG. 9 is a cross section showing a monocrystalline silicon wafer in accordance with a seventh embodiment of the present invention.

FIG. 9 is a cross section showing a monocrystalline silicon wafer in accordance with a seventh embodiment of the present invention. Referring to FIG. 9, a first monocrystalline silicon substrate 4 where a semiconductor device is to be formed and a second monocrystalline silicon substrate 5 which serves as a base thereof are attached to each other by an oxide film 6. The monocrystalline silicon wafer of the present embodiment has alkaline metal and alkaline earth metal of at most $2.6\times10^{11}$ atoms/cm$^2$ in total, sodium concentration of at most $5\times10^{10}$ atoms/cm$^2$, potassium concentration of at most $2\times10^{11}$ atoms/cm$^2$, and calcium concentration of at most $1\times10^{10}$ atoms/cm$^2$ at a surface where first monocrystalline silicon substrate 4 and second monocrystalline substrate 5 are attached to each other. A gate oxide film formed using such a monocrystalline silicon wafer has a uniform thickness.

EIGHTH EMBODIMENT

The present embodiment relates to a method of manufacturing a monocrystalline silicon wafer shown in FIG. 9.

Figure 10A:
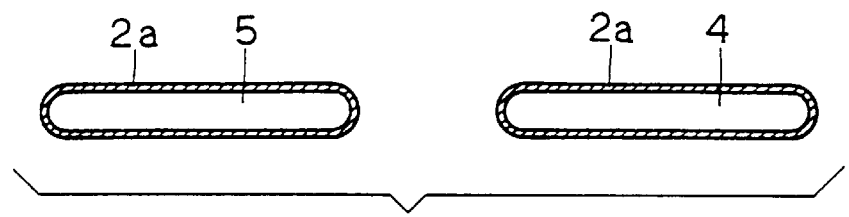
FIG. 10(a)–(d) is a series of cross sections sequentially showing a monocrystalline silicon substrate in each of the steps in a method of manufacturing a monocrystalline silicon wafer shown in FIG. 9.
Figure 10B:
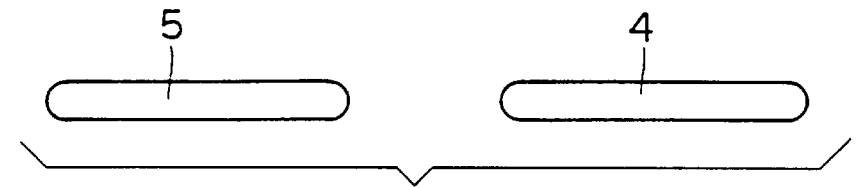

Referring to FIG. 10(a), a first alkali-washed monocrystalline silicon substrate 4 where a semiconductor device is to be formed and a second alkali-washed monocrystalline silicon substrate 5 which services as a base thereof are prepared. A contaminant layer 2a having sodium concentration of at least $5\times10^{10}$ atoms/cm$^2$, potassium concentration of at least $2\times10^{11}$ atoms/cm$^2$, calcium concentration of at least $1\times10^{10}$ atoms/cm$^2$, and total concentration of alkaline metal and alkaline earth metal of at least $2.6\times10^{11}$ atoms/cm$^2$ is formed on each of monocrystalline silicon substrates 4 and 5.

Referring to FIG. 10(a) and (b), first and second monocrystalline silicon substrates 4 and 5 are washed with diluted hydrochloric acid or diluted hydrofluoric acid to remove respective contaminant layers 2a. As a result, each of monocrystalline silicon substrates 4 and 5 has alkaline metal and alkaline earth metal of at most $2.6\times10^{11}$ atoms/cm$^2$ in total, sodium concentration of at most $5\times10^{10}$ atoms cm$^2$, potassium concentration of at most $2\times10^{11}$ atoms/cm$^2$, and calcium concentration of at most $1\times10^{10}$ atoms/cm$^2$ at a surface thereof.

Figure 10C:
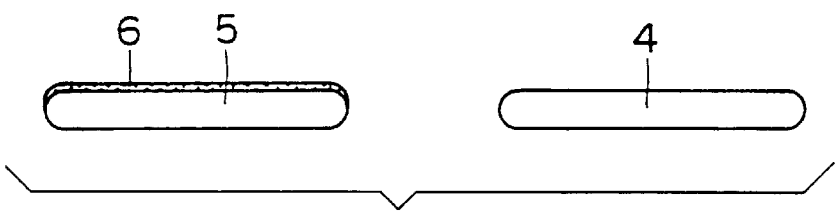

Referring to FIG. 10(c), an oxide film 6 is formed on a surface of one or both of first and second monocrystalline silicon substrates 4 and 5. An example in which oxide film 6 is formed only on the surface of second monocrystalline silicon substrate 5 will be described herein.

Figure 10D:
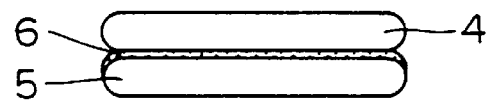
Figure 11A:
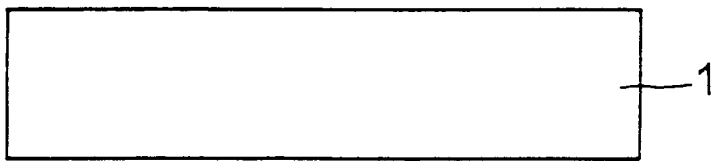
FIG. 11(a)–(e) is a series of cross sections sequentially showing a semiconductor device in each of the steps in a conventional method of manufacturing an MOSFET.
Figure 11B:
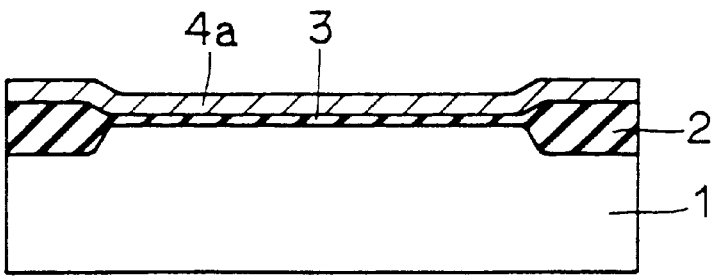
Figure 11C:
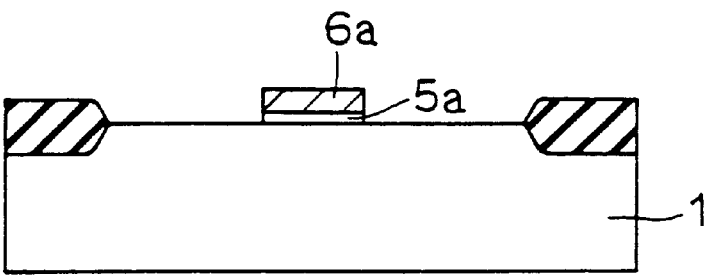
Figure 11D:
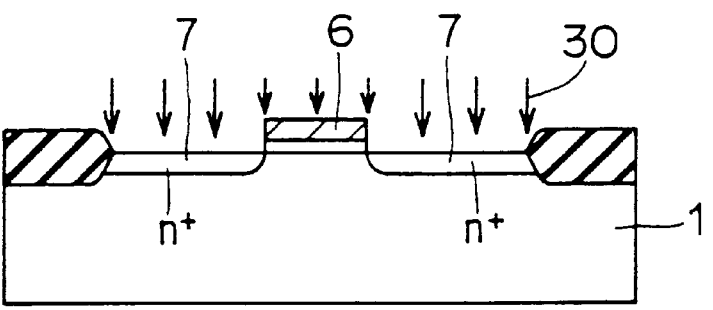
Figure 11E:
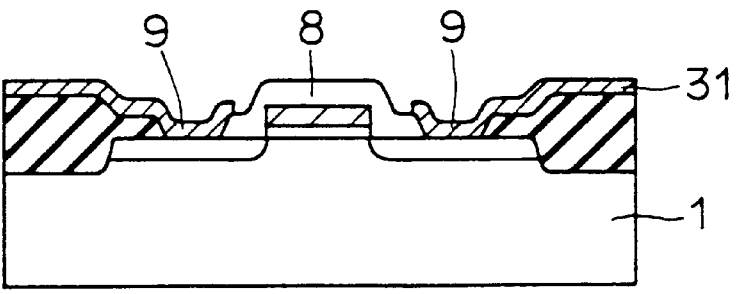
Figure 12:
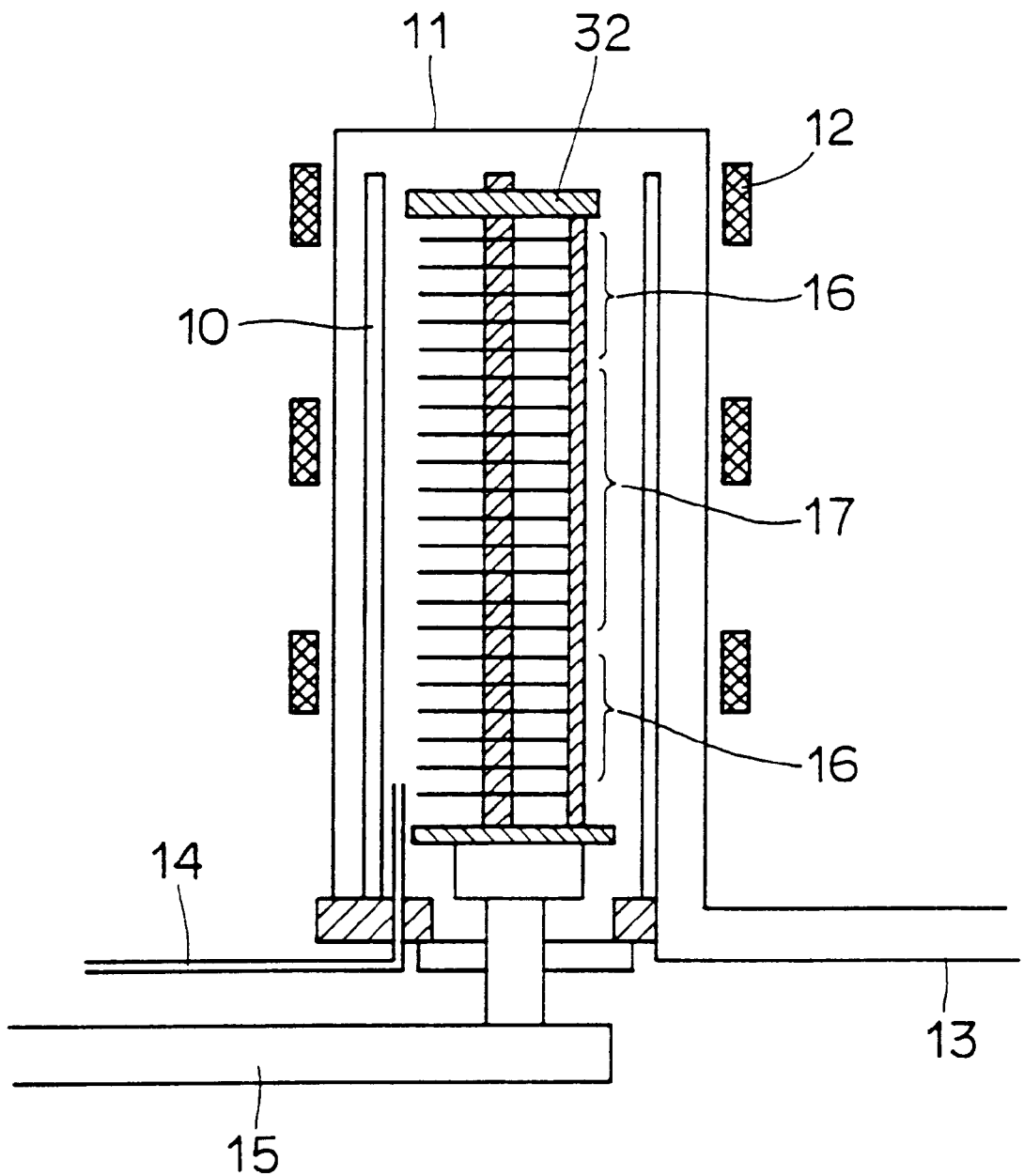
FIG. 12 is a diagram conceptually showing a conventional vertical type thermal oxidation furnace.
Figure 13A:
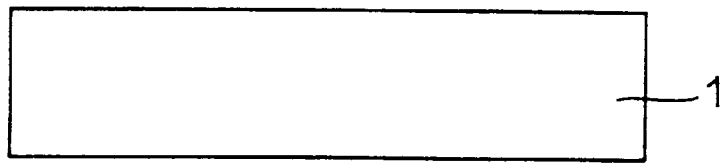
FIG. 13(a)–(d) is a series of cross sections sequentially showing a semiconductor device in each of the steps in a conventional method of forming an LOCOS oxide film.
Figure 13B:
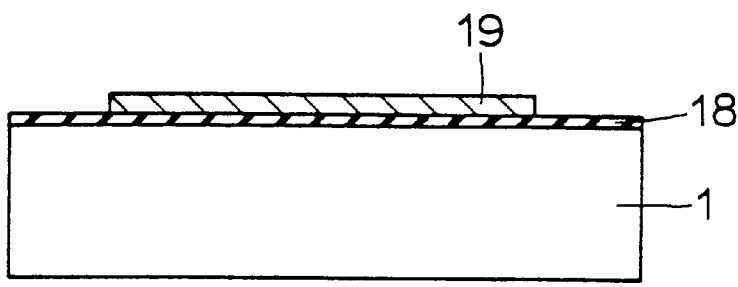
Figure 13C:
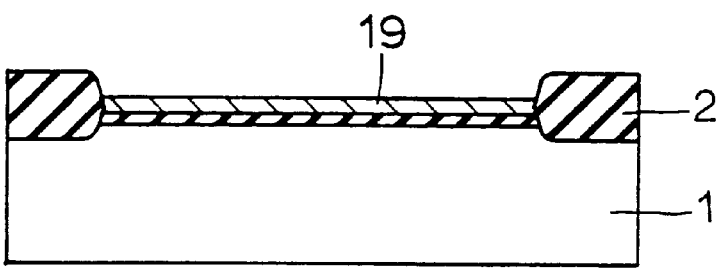
Figure 13D:
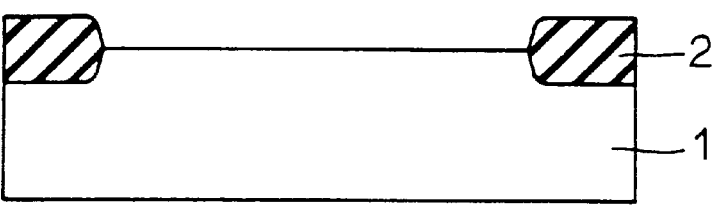

Referring to FIG. 10(d), first monocrystalline silicon substrate 4 is placed on second monocrystalline silicon substrate 5. Then, they are thermally processed and attached to each other.

Thus, a monocrystalline silicon wafer including first and second monocrystalline silicon substrates 4 and 5 attached to each other, and having total concentration of alkaline metal and alkaline earth metal of at most $2.6\times10^{11}$ atoms/cm$^2$, sodium concentration of at most $5\times10^{10}$ atoms/cm$^2$, potassium concentration of at most $2\times10^{11}$ atoms/cm$^2$, and calcium concentration of at most $1\times10^{10}$ atoms/cm$^2$ at a surface where first and second monocrystalline silicon substrates 4 and 5 are attached to each other.

Although an example in which contaminant layer 2a is removed with diluted hydrochloric acid or diluted hydrofluoric acid has been described with reference to FIG. 10(a) and (b), the present invention is not limited to this, and contaminant layer 2a may be etched away by thermal processing in hydrochloric acid gas.

In a monocrystalline silicon wafer in accordance with a first aspect of the present invention, a monocrystalline silicon substrate has potassium concentration of at most $2\times10^{11}$ atoms/cm$^2$ at an outer surface thereof, and therefore, potassium contained in the monocrystalline silicon wafer will not diffuse and therefore will not contaminate other monocrystalline silicon wafers at the time of thermal processing in a thermal oxidation furnace. Consequently, a silicon oxide film formed using this monocrystalline silicon substrate has a uniform thickness.

A monocrystalline silicon wafer in accordance with a second aspect of the present invention, potassium concentration is at most $2\times10^{11}$ atoms/cm$^2$ at an interface between a monocrystalline silicon substrate and a polysilicon film, and therefore, potassium contained in the monocrystalline silicon wafer will not contaminate other monocrystalline silicon wafers at the time of thermal processing in a thermal oxidation furnace. Consequently, a silicon oxide film formed using this monocrystalline silicon wafer has a uniform thickness.

In a monocrystalline silicon wafer in accordance with a third aspect of the present invention, a polysilicon film has potassium concentration of at most $2\times10^{11}$ atoms/cm$^2$ at an outer surface thereof, and therefore, potassium contained in the monocrystalline silicon wafer will not contaminate other monocrystalline silicon wafers at the time of thermal processing in a thermal oxidation furnace. Consequently, a silicon oxide film formed using this monocrystalline silicon wafer has a uniform thickness.

In a monocrystalline silicon wafer in accordance with a fourth aspect of the present invention, an oxide film containing phosphorus is formed on a bottom surface of a monocrystalline silicon substrate. The oxide film containing phosphorus has a gettering effect. Therefore, alkaline metal and alkaline earth metal contained in the monocrystalline substrate are captured by the oxide film containing phosphorus. Consequently, alkaline metal and alkaline earth metal contained in the monocrystalline silicon wafer will not contaminate other monocrystalline silicon wafers at the time of thermal processing in a thermal oxidation furnace. As a result, a silicon oxide film formed using this monocrystalline silicon wafer has a uniform thickness.

In a monocrystalline silicon wafer in accordance with a fifth aspect of the present invention, potassium concentration is at most $2 \times 10^{11}$ atoms/cm$^2$ at a surface where first and second monocrystalline silicon substrates are attached to each other, and therefore, potassium contained in the monocrystalline silicon wafer will not contaminate other monocrystalline silicon wafers at the time of thermal processing in a thermal oxidation furnace. As a result, a silicon oxide film formed using this monocrystalline silicon wafer has a uniform thickness.

In a monocrystalline silicon wafer in accordance with a sixth aspect of the present invention, a monocrystalline silicon substrate has potassium concentration of at most $1 \times 10^{16}$ atoms/cm$^3$, and therefore, potassium contained in the monocrystalline silicon wafer will not contaminate other monocrystalline silicon wafers at the time of thermal processing in a thermal oxidation furnace. Consequently, a silicon oxide film formed using this monocrystalline silicon wafer has a uniform thickness.

In a monocrystalline silicon wafer in accordance with a seventh aspect of the present invention, a polysilicon film has potassium concentration of at most $1 \times 10^{16}$ atoms/cm$^3$, and therefore, potassium contained in the monocrystalline silicon wafer will not contaminate other monocrystalline silicon wafers at the time of thermal processing in a thermal oxidation furnace. Consequently, a silicon oxide film formed using this monocrystalline silicon wafer has a uniform thickness.

In a method of thermally oxidizing a surface of a monocrystalline silicon wafer in accordance with an eighth aspect of the present invention, a dummy wafer having a potassium concentration of at most $2 \times 10^{11}$ atoms/cm$^2$ at an outer surface thereof is placed in a thermal oxidation furnace, and therefore, potassium contained in the dummy wafer will not contaminate a monocrystalline silicon wafer to be processed. Consequently, a silicon oxide film formed on a surface of the monocrystalline silicon wafer has a uniform thickness.

In a method of thermally oxidizing a surface of a monocrystalline silicon wafer in accordance with a ninth aspect of the present invention, a dummy wafer containing potassium of at most $1 \times 10^{16}$ atoms/cm$^3$ is placed in a thermal oxidation furnace, and therefore, potassium contained in the dummy wafer will not contaminate a monocrystalline silicon wafer to be processed. Consequently, a silicon oxide film having a uniform thickness is formed on a surface of a monocrystalline silicon wafer to be processed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A monocrystalline silicone substrate having a potassium concentration of at most $2 \times 10^{11}$ atoms/cm$^2$ at an outer surface thereof.

2. The monocrystalline silicon substrate according to claim 1 having, at said outer surface thereof:

an alkali metal and alkaline earth metal concentration of at most $2.6 \times 10^{11}$ atoms/cm$^2$ in total;

a sodium concentration of at most $5 \times 10^{10}$ atoms/cm$^2$; and a calcium concentration of at most $1 \times 10^{10}$ atoms/cm$^2$.

3. A wafer, comprising:

a monocrystalline silicon substrate; and a polysilicon film formed on a bottom surface of said monocrystalline silicon substrate, wherein the potassium concentration at an interface between said monocrystalline silicon substrate and said polysilicon film is at most $2 \times 10^{11}$ atoms/cm$^2$.

4. The wafer according to claim 3, having, at said interface between said monocrystalline silicon substrate and said polysilicon film:

an alkali metal and alkaline earth metal concentration of at most $2.6 \times 10^{11}$ atoms/cm$^2$;

a sodium concentration of at most $5 \times 10^{10}$ atoms/cm$^2$; and a calcium concentration of at most $1 \times 10^{10}$ atoms/cm$^2$.

5. A wafer, comprising:

a monocrystalline silicon substrate; and a polysilicon film formed on a bottom surface of said monocrystalline silicon substrate, wherein said polysilicon film has a potassium concentration of at most $2 \times 10^{11}$ atoms/cm$^2$ at an outer surface thereof.

6. The wafer according to claim 5, wherein said polysilicon film has, at said outer surface thereof:

an alkaline metal and alkaline earth metal of at most $2.6 \times 10^{11}$ atoms/cm$^2$ in total;

a sodium concentration of at most $5 \times 10$ atoms/cm$^2$; and a calcium concentration of at most $1 \times 10^{10}$ atoms/cm$^2$.

7. A wafer, comprising:

a monocrystalline silicon substrate;

an oxide film containing phosphorus formed on a bottom surface of said monocrystalline silicon substrate; and a polysilicon film formed on the bottom surface of said monocrystalline silicon substrate to cover said oxide film.

8. A wafer, comprising:

a first monocrystalline silicon substrate and a second monocrystalline silicon substrate which are attached to each other, wherein:

the potassium concentration is at most $2 \times 10^{11}$ atoms/cm$^2$ at a surface where said first monocrystalline silicon substrate and said second monocrystalline silicon substrate are attached to each other.

9. The wafer according to claim 8, wherein said surface where said first monocrystalline silicon substrate and said second monocrystalline silicon substrate are attached to each other has:

an alkali metal and alkaline earth metal concentration of at most $2.6 \times 10^{11}$ atoms/cm$^2$ in total;

a sodium concentration of at most $5 \times 10^{11}$ atoms/cm$^2$; and a calcium concentration of at most $1 \times 10^{10}$ atoms/cm$^2$.

10. A wafer, comprising:

a monocrystalline silicon substrate having a potassium concentration of at most $1 \times 10^{16}$ atoms/cm$^3$.

11. A wafer, comprising:

a monocrystalline silicon substrate; and a polysilicon film formed on a bottom surface of said monocrystalline silicone substrate, wherein said polysilicon film has a potassium concentration of at most $1 \times 10^{16}$ atoms/cm$^3$.

* * * * *

UNITED STATES PATENT AND TRADEMARK OFFICE
CERTIFICATE OF CORRECTION

PATENT NO. : 5,928,786
DATED : July 27, 1999
INVENTOR(S) : YASUKAZU MUKOGAWA, et al.

It is certified that error appears in the above-identified patent and that said Letters Patent is hereby corrected as shown below:

Column 6, line 53, change "$2 \times 10^{12}$ atoms/cm$^2$" to --$2 \times 10^{11}$ atoms/cm$^2$--.

Signed and Sealed this

Twenty-eighth Day of December, 1999

*Attest:*

Q. TODD DICKINSON

*Attesting Officer*     *Acting Commissioner of Patents and Trademarks*